Nov. 21, 1972 M. B. VORA 3,703,420

LATERAL TRANSISTOR STRUCTURE AND PROCESS FOR FORMING THE SAME

Filed March 3, 1970 3 Sheets-Sheet 1

INVENTOR
MADHUKAR B. VORA

BY Sughrue, Rothwell, Mion, Zinn & Macpeak
ATTORNEYS

LATERAL TRANSISTOR STRUCTURE AND PROCESS FOR FORMING THE SAME

Filed March 3, 1970 3 Sheets-Sheet 3

United States Patent Office 3,703,420

Patented Nov. 21, 1972

3,703,420

LATERAL TRANSISTOR STRUCTURE AND PROCESS FOR FORMING THE SAME

Madhukar B. Vora, Beacon, N.Y., assignor to International Business Machines Corporation, Armonk, N.Y.

Filed Mar. 3, 1970, Ser. No. 16,103
Int. Cl. H01l *7/36, 5/00;* C23c *13/00*
U.S. Cl. 148—175 13 Claims

ABSTRACT OF THE DISCLOSURE

A novel transistor wherein current travels laterally along the semi-conductor surface having polycrystalline diffusion paths in its surface which serve as the means of introducing impurities in a vertical orientation into surrounding single crystal material because of the more rapid diffusion rate of polycrystalline material. Appropriate collector/emitter and base contacts are made thereto.

Process for forming such a lateral semi-conductor by diffusing through a polycrystalline diffusion path or channel, diffusion rapidly taking place in a lateral direction through the polycrystalline silicon which is in an epitaxial layer. In an alternate embodiment, diffusion is through monocrystalline areas to an ultra highly doped substrate area.

BACKGROUND OF THE INVENTION

Field of the invention

The present invention relates to lateral transistors and processes for forming the same.

Description of the prior art

Lateral transistors can be described as transistors in which the current, in passing from the emitter across the base of the collector, travels laterally along the semiconductor surface rather than vertically into the semiconductor structure.

Several transistors having generally lateral structures have been described in the prior art. For instance, in U.S. Pat. 3,252,063, Ziffer, a planar power transistor is described wherein an isolated base contact is formed through the use of a buried diffusion. This reference does not teach a device having polycrystalline regions which are used, inter alia, to form uniform lateral diffusions.

U.S. Pats. 3,246,214 Hugle, and 3,283,223 DeWitt, et al. deal with lateral transistors. However, these transistors suffer from the typical faults encountered by the prior art in forming lateral transistors, that is, it is very difficult to make contact to the very narrow base, and it is very difficult to form well-defined vertical junctions.

SUMMARY OF THE INVENTION

Each of the above problems is solved by the present invention and not only is an improved lateral transistor provided, but more importantly, an extremely simplified fabrication process for forming lateral transistors is provided.

From a first aspect, the present invention provides a novel lateral transistor having incorporated therein polycrystalline silicon, the polycrystalline silicon having earlier served as a preferential diffusion route for both base and emitter diffusions.

The primary feature of the present lateral transistor involves a process for the production thereof. Two embodiments have been discovered. One embodiment entitled "the polycrystalline method" comprises actually forming polycrystalline zones or masses in the semi-conductor substrate (at least in the epitaxial layers grown thereon), and then diffusing impurities through this polycrystalline layer. Since impurity diffusion into polycrystalline silicon proceeds at a rate up to three times as fast and more as that into monocrystalline silicon, the impurities enter the polycrystalline zone and laterally diffuse into the monocrystalline silicon. Thus, by initially diffusing the base $P^+$ impurity into the polycrystalline zone and then, through the same window or opening, immediately diffusing the $N^+$ emitter impurity, two P-N junctions on either side of the polycrystalline zone are formed.

A similar monocrystalline process is provided where a deep diffusion into a highly doped buried diffusion layer is used. This buried diffusion, doped to such a degree that compensation cannot occur, provides a large base width at the bottom of the zone.

It is thus one object of this invention to provide an improved lateral transistor structure having a narrow base width and small effective emitter width.

It is a further object to provide a novel lateral transistor structure providing higher current carrying capability, higher $f_t$ and lower base resistance.

It is a further object to provide a novel formation scheme for lateral transistors wherein diffusion is through a polycrystalline zone and a scheme wherein diffusion is through a monocrystalline zone.

It is yet another object of this invention to provide a process for forming lateral transistors wherein emitter-base alignment problems are removed since emitter and base diffusion are through the same hole.

It is finally an object of this invention to provide lateral transistor having sharp, well-defined vertical junctions.

These and other objects will become clear upon a reading of the following material.

DETAILED DESCRIPTION OF THE PREFERRED EMBODIMENTS

The present invention provides a novel lateral transistor having uniform junctions and more particularly a novel and unique process for forming lateral transistors. The term "lateral transistor" has been heretofore described, and will be well understood by those skilled in the art.

The transistors of the present invention have a very narrow base width and a very small effective emitter width. The advantages of the lateral structure for a transistor are that the current carrying capability is higher, a higher $f_t$ is provided, base resistance is lower, and fine alignment problems are eliminated.

In a "lateral" transistor, the side walls of a diffused zone are the active areas of the transistor, and the bottom of the diffusion area can be considered substantially inactive. Accordingly, diffusions must be deep to form the active side walls. To provide novel processes for forming lateral transistors, this invention contemplates two methods, the first of which may be called a monocrystalline method, and the second of which may be called a polycrystalline method.

The polycrystalline method involves the use of polycrystalline material in the center or interior of the transistor to serve as a preferential diffusion route for impurities. It has been found that impurity diffusion through polycrystalline material, for instance polycrystalline silicon, is much faster than through monocrystalline silicon. Presumably this is due to grain-boundary diffusion. Accordingly, if diffusion is into a polycrystalline silicon area in the center of a transistor, impurities will diffuse very fast through this polycrystalline material and thereby laterally spread out or diffuse into the semi-conductor or transistor body itself. Polycrystalline silicon serves excellently for the purpose of enabling the formation of a straight diffusion boundary, in other words, impurities diffused to a substantially equal degree in a horizontal plane. This is one advantage over the later-described monocrystalline method which yields a more sloping diffusion wall.

It will be understood that both base and emitter impurities are diffused through the polycrystalline silicon. The polycrystalline method of the present invention will be apparent. In the following description, the substrate material is silicon. It will be apparent to one skilled in the art that other materials can be used and further that other $P^+$ and $N^+$ impurities are operable in this invention in addition to those discussed in the present example which are, respectively, boron ($P^+$) and arsenic or phosphorous ($N^+$).

Figure 1:
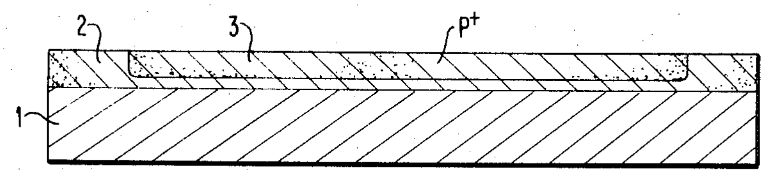
FIGS. 1–5 are schemaitc representations of a lateral transistor being formed according to the polycrystalline method of this invention.

With specific reference to the drawings to aid in an understanding of the polycrystalline method, FIG. 1 shows a $P^-$ type silicon substrate 1 (boron=$10^{15}$–$10^{16}$ atoms/cc.) having grown thereon an $N^-$ type epitaxial ($10^{15}$ atoms/cc. phosphorous, hereinafter "epi") region 2 of 5 microns thickness, and with the $P^+$ region 3 diffused therein. $P^+$ diffusion was to a concentration of $10^{20}$ atoms/cc., with boron.

Figure 2A:
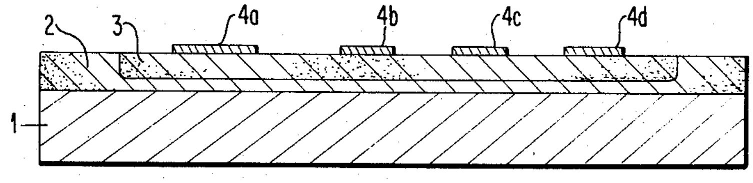
Figures 2B, 5:
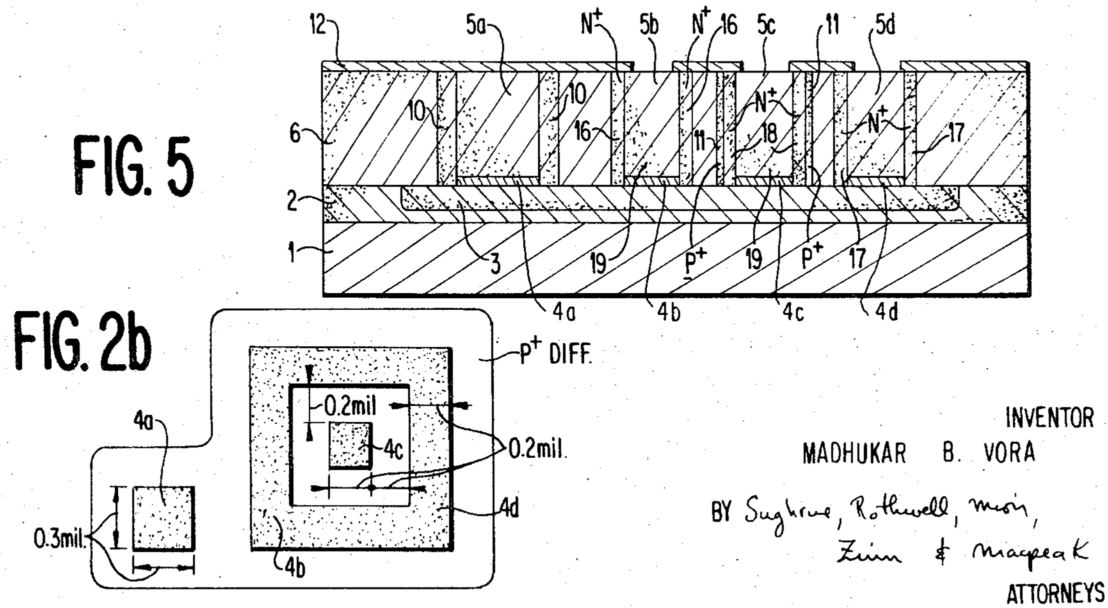
Figure 6A:
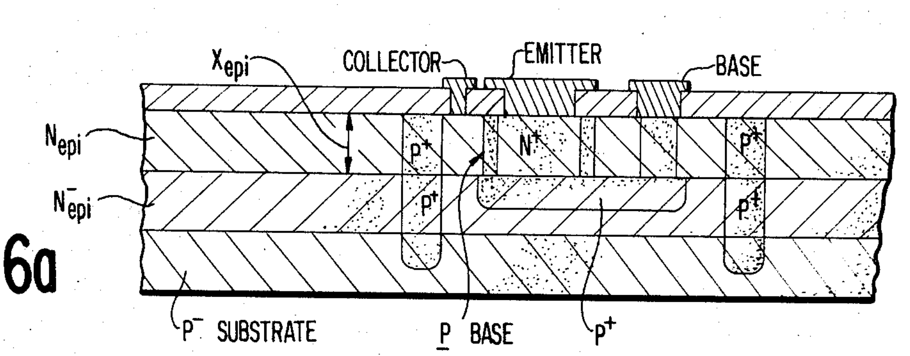
FIGS. 6*a* and 6*b* are, respectively, a vertical and horizontal view of a lateral transistor formed according to the monocrystalline method of this invention.
Figure 6B:
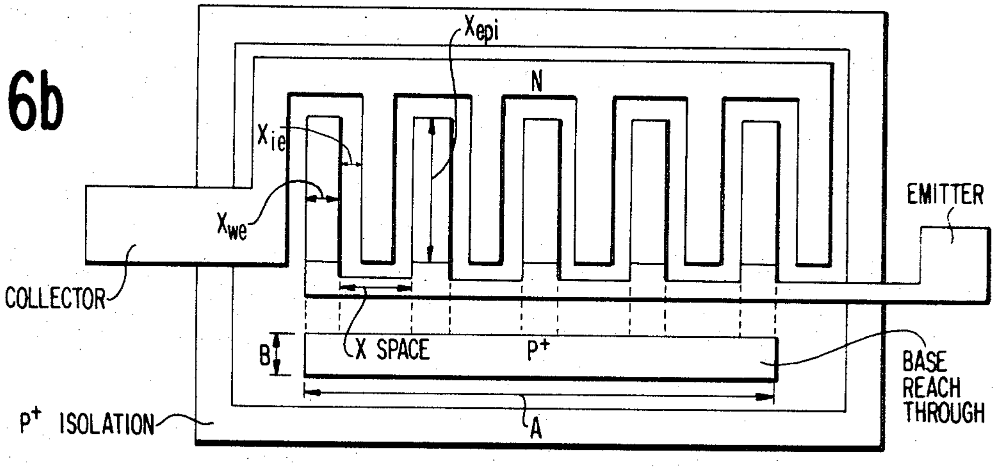

The next step in this embodiment, though any substantial equivalent could be utilized, is to form an oxidized layer, by any known art technique, 0.5 micron thick on top of the epitaxial layer 2 and $P^+$ region 3 and to remove all of the silicon dioxide which is formed except for islands 4 (having the dimensions as in FIG. 2*b*) at certain select portions on top of the semi-conductor substrate 1 of FIG. 2*a*. The importance of these islands 4 will become apparent. The device at this stage is shown in FIG. 2*a*. It will be obvious that the thicknesses and dimensions of the layers and islands described are non-critical, and that any $SiO_2$ formation technique can be used. FIG. 2*b* is a top view of the transistor of FIG. 2*a*.

Figure 3:
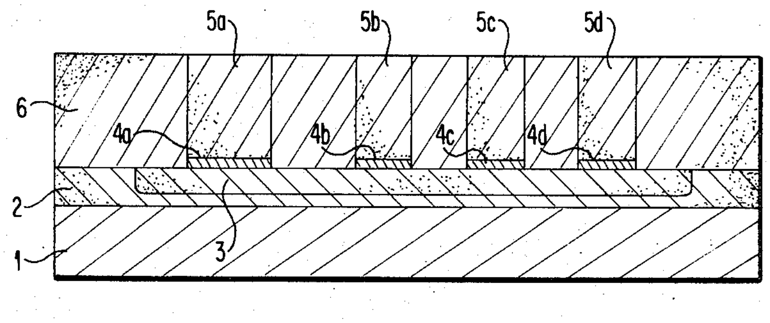

The next step in the present invention is illustrated (after completion) in FIG. 3 of the drawings. This step involves growing an epitaxial silicon layer 6 over the heretofore deposited silicon dioxide islands 4 and the remainder of the exposed surfaces. This is a $N^-$ type epi layer with a concentration of $5\times10^{16}$ atoms/cc. of phosphorous.

It has been found that polycrystalline silicon forms over the silicon dioxide "islands" **4*a*–4*d* and that single crystalline silicon forms over the bare or unprotected substrate, epitaxially assuming the orientation of the substrate. The substrate had a [1, 0, 0] orientation. Thus, in those areas over the islands 4*a*–4*d*, polycrystalline epitaxial material forms and this polycrystalline epitaxial material is repreesnted by 5*a*–5*d***, respectively. The newly grown epitaxial layer, which will be single crystal over the "bare" substrate, is represented by numeral 6. The above step is really integral to the present invention since it is a utilization of the rapid diffusion capabilities of polycrystalline silicon which enables the lateral transistor of this invention to be formed. Formation of the epitaxial layers discussed can be by any standard state of the art technique and in this example was by the decomposition of silane at high temperature, say 1200° C. The total epitaxial layer, and of course the polycrystalline layer, had a thickness of 3 microns.

Figure 4:
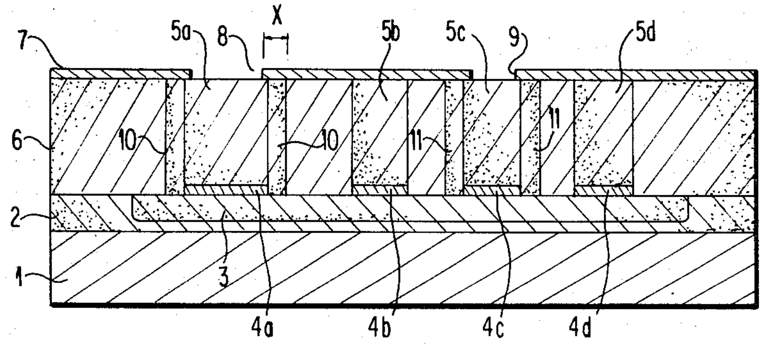

The next step in the invention is to diffuse P type impurities. This is done by initially forming, by any state of the art technique, a silicon dioxide mask 7 of 5,000 A. thickness over the epitaxial layer 6. Obviously, other equivalent masking materials could be used instead of silicon dioxide. Further, the thickness of this layer is not important as long as a masking function can be performed by the silicon dioxide layer 7. After forming holes 8 and 9 through the silicon dioxide layer 7, diffusion of a P type impurity is conducted. The rate of diffusion through the polycrystalline silicon 5 is approximately 3 times or more as fast as through the monocrystalline silicon 6. Accordingly, during this step, the P-type impurity enters the holes 8 and 9 and very rapidly diffuses through the crystalline material 5 into the single crystal N-epitaxial layer 6. Thus P-type zones 10—10 and 11—11 are formed, respectively, at the lateral portions of polycrystalline zones **5*a* and 5*c*. The P diffusion is conducted at about 1000° C. for 2 hours using a boron-containing atmosphere. The lateral depth of each P-type zone formed was 40 microinches and the concentration of the P-type impurity in the zones 10—10 and 11—11 is $10^{19}$ atoms/cc. The concentration in the polycrystalline material 5*a* and 5*c*** is also $10^{19}$ atoms/cc. At the completion of this step, the device is shown in FIG. 4. The lateral distance of diffusion is represented by the distance X in FIG. 4.

The next step in the completion of the transistor of this invention is the N-type impurity diffusion step. Initially, the silicon dioxide layer is regrown, preferably by a low temperature technique, and new holes are opened in the newly grown silicon dioxide layer 12 over the polycrystalline areas **5*b*, 5*c*, and 5*d*. Reference should be made to FIG. 5 for a description of this particular step of the invention. Of course, the N-type diffusion which is performed introduces and forms N-type zones 16, 16 and 17, 17, respectively, directly to the sides of polycrystalline material areas 5*b* and 5*d*, respectively. These N-type zones are not in direct contact with any P-type zone. However, for polycrystalline area 5*c*, immediately adjacent to which P-type zones 11, 11 had already been formed in the single crystal material, N-type zones 18, 18 are formed which are in immediate and direct contact with the earlier formed P-type zones 11, 11. Thus, P-N junctions 11, 18 and 11, 18 on either side of the polycrystalline zone 5*c*** are formed.

The $N^+$ diffusion in the present instance was to a concentration of $10^{21}$ atoms/cc. of arsenic [$C_0$]. Typically, the $N^+$ diffusion will be to a percentage such as used by the prior art to gain good emitter efficiency. Generally, $N^+$ diffusion will be of an order of magnitude of 1.5–2.0 times greater than that of the $P^+$ diffusion. This, of course, provides the good emitter efficiency.

In the present instance, arsenic diffusion was conducted at 1000° C. for an hour and a half. The $N^+$ arsenic diffused approximately 30 microinches into the lateral sidewalls, e.g., into the single crystal material. Thus, since the $N^+$ arsenic diffusion is approximately two orders of magnitude greater than the $P^+$ diffusion, and is to a depth of 30 microinches into the sidewall, it can be seen that the effective base width of the lateral transistor of this example is 10 microinches, i.e., the 40 microinches at the $P^+$ diffusion less the 30 microinches of the $N^+$ dimension. Typically, $P^+$ base diffusion could be to a distance of 40–100 microinches, and $N^+$ emitter diffusion would be to a distance of 30–80 microinches, with 80–100 microinches and 60–80 microinches being preferred, respectively. In other words, the only truly necessary parameter, since state of the art concentrations can be used for the $P^+$ and $N^+$ regions, is that the $P^+$ zone be diffused deeper in the lateral direction than the $N^+$ zone. Obviously, if this was not the case, a P-N junction could not result.

At this stage of manufacture, some of the future topography of the device can be recited. All elements are standard in the art. For instance, directly to polycrystalline zone **5*a*, the base contact will be opened and base contact made thereto. Directly to polycrystalline zone 5*b***, collector contact will be made. A similar collector contact will be made to polycrystalline zone *5d*. Emitter contact will be made to polycrystalline zone *5c*. In the above illustration, the emitter is bounded by N-type regions 18, 18, whereas the base of the transistor is bounded by P-type regions 10, 10. The collector zones are bounded by N-type regions 16, 16 and 17, 17. Of course, the former P+ region serves as an underlying deep-diffused contact. Outdiffusion is not any problem as long as temperatures are low compared to the diffusion temperatures, i.e., say about a 100° C. drop.

In essence, with the structure of FIG. 5, the device may be considered substantially complete. In fact, with the formation of P+ isolations at either end of the shown device, the isolations extending into the P substrate, the lateral transistor of the present invention formed by the polycrystalline method is completed.

It has been found, in fact, that according to the processing scheme of this invention, lateral diffusion uniformly proceeds. Accordingly, base width will be uniform even if the interface between the polycrystalline silicon and the single crystal silicon is somewhat uneven.

From the above, it will be seen that the problem of base contact is solved by the use of the buried contact diffusion, the base contact being connected thereto via a reach-through diffusion. Well-defined vertical junctions are provided inherently by the polycrystalline zones into which the diffusions are made.

Before continuing with a description of many various structures which could be formed according to the polycrystalline method, at this time a discussion will be offered relative to the monocrystalline method of this invention. As the suggested titles imply, the essential concept involved in the monocrystalline method is to replace the polycrystalline regions with single crystal or monocrystalline regions. The process steps and the resultant transistor are described in the following material, and reference should be made to FIG. *6a* and *6b* in conjunction with FIGS. 7–12 of the drawings. FIG. *6a* is a side schematic view of the final lateral transistor formed in accordance with the monocrystalline method (described below) of this invention, while FIG. *6b* is a horizontal view from above of the lateral transistor shown in FIG. *6a*. In FIG. *6a*, the various generic zones are identified. Full reference should be made to FIGS. 7–12 for the exact description of the various regions. It should be understood, however, that FIG. *6a* represents the completed lateral transistor formed by the processing scheme explained below and illustrated in FIGS. 7–12. The following dimensions and parameters are given for the transistor horizontal geometry shown in FIGS. *6a* and *6b*.

$X_{epi}$ (FIG. *6a*): 1 micron
$X_{le}$ (FIG. *6b*): 2.0 mil
$X_{we}$ (FIG. *6b*): 0.2 mil
A: 3 mill
B: 0.2 mil
$X_{space}$: 0.4 mil
$R_{db}$ (base sheet resistivity): 10K/□ (range 5–10K/□)

These dimensions give the following transistor characteristics:

$$r_{bb}' = \frac{R_{db} \times X_{epi}}{3.0 \times (X_{LE} \times 5 + 10 X_{WE})}$$

=intrinsic base resistance of the transistor

=10 ohms $f_t$=10–15 Kmc. (peak) based on existing 0.1 mil devices

=30–150 (current gain)

$C_{CB}$=0.8 pf. (collector base capacitance)

$C_{BE}$=1.5 to pf. (base emitter capacitance)

$R_c$=40 ohm (collector resistance)

Turning now to a description of the mono process, essentially the polycrystalline regions are replaced with a single crystalline region.

Figure 7:
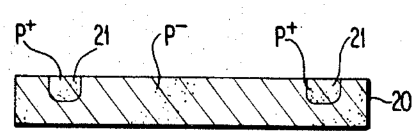
FIGS. 7–12 are schematics of a lateral transistor during various stages of processes according to the monocrystalline method of this invention.

A P-silicon substrate 20 doped with boron to a concentration of $10^{15}$ atoms/cc. has two separate P+ isolation diffusions 21, 21 formed therein. This is shown in FIG. 7 of the drawings. P+ isolations are with boron to a concentration of $10^{20}$ atoms/cc. ($10^{19}$–$10^{20}$).

Figure 8:
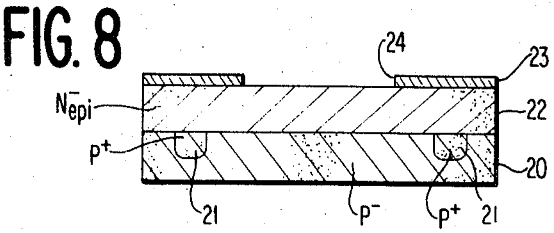
Figure 9:
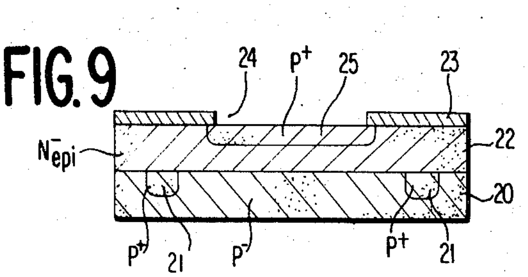

The next step is to grow an N− epitaxial layer 22 over the P+ substrate 20. In this instance, the total thickness of the epitaxial layer 22 was 1 micron, and this epitaxial layer was grown by decomposition of $SiCl_4$ at high temperatures (1200° C.). The N-type impurity was phosphorous present in the layer at a total concentration of $10^{16}$ atoms/cc. After growth of the N− epitaxial layer, the device is shown in FIG. 8. Immediately thereafter, the upper portion can be oxidized to form silicon dioxide layer 23, 0.5 micron thick. Alternatively, this layer can be grown by decomposition processes or the like. Preferably a low temperature silicon dioxide layer is formed. Immediately after growth of the silicon dioxide layer 23 and etching therein of hole 24, the structure has the configuration shown in FIG. 8. The next major step is to diffuse therein the buried base contact region 25. In the present instance, this P+ region was formed by the diffusion into the N− epitaxial layer 22 of boron at the following conditions: 1000° C., 2 hours, $10^{14}$ atoms/cc. boron doped silicon powder to yield a concentration of the P+ impurity in the N− silicon epitaxial layer 22 of $10^{19}$ atoms/cc. The structure after P+ base contact diffusion is shown in FIG. 9.

Figure 10:
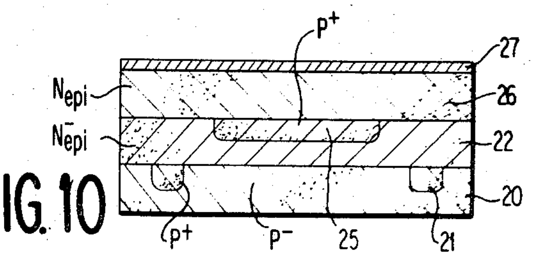

The next step in this invention is to grow an N epitaxial layer 26, the impurity being phosphorous at a centration of $10^{16}$ atoms/cc., and oxidize the N epitaxial layer to form a 0.5 micron thick silicon dioxide layer thereover. The silicon dioxide layer could also be grown by decomposition, or the like. The N epitaxial layer is grown by the decomposition of $SiCl_4$ at high temperature (1200° C.) to a thickness of 1 micron. This is substantially non-important and thickness is of from about 1 to about 5 microns could be used. The structure after growth of the N epitaxial layer and the silicon dioxide layer thereover is shown in FIG. 10.

Figure 11:
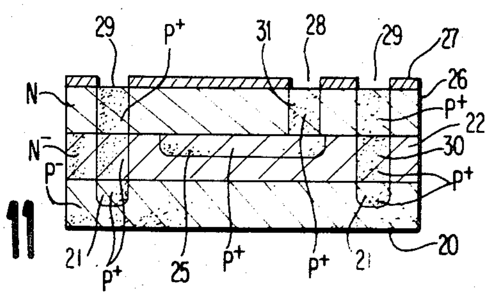

The next step is to perform base reach-through diffusion and isolation reach-through diffusions. All of these diffusions are P+ types with boron to state of the art concentrations, and the device after performance of this step is shown in FIG. 11. It can be seen that after opening base diffusion holes 28 and isolation diffusion holes 29, 29, contact can be made directly to the initial P+ isolation picket 21, 21 in the P− substrate 20. The final P+ isolation reach-throughs are shown by numerals 30, 30, and the base diffusions reach-through is shown by numeral 31.

Figure 12:
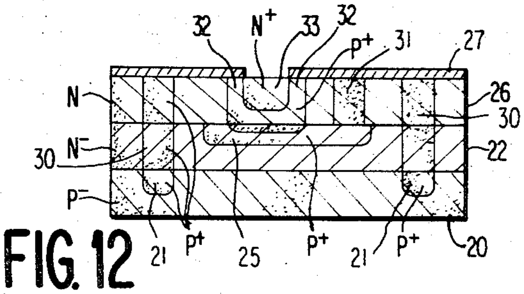

As illustrated in FIG. 12, the final steps in the present invention are to reoxidize the silicon dioxide layer 27, thereby covering the reach-through holes 28 and 29, 29. The next step is to open a base diffusion hole and perform a base diffusion at 1000° C. to a $C_0=10^{19}$ atoms/cc. with a boron-containing atmosphere. The time of diffusion was 2 hours. Immediately following base diffusion to yield the base regions 32, 32, emitter diffusion is performed through the same hole used for base diffusion, thereby eliminating all alignment problems. Emitter diffusion is conducted at 1000° C. for 1 hour to yield a $C_0$ of $10^{21}$ atoms/cc. of arsenic. This yields the emitter zone 33. The lateral "spread" of the P+ base diffusion was 40 microinches, and the lateral spread of the N+ emitter zone was 30 microinches, for a lateral transistor base width of 10 microinches. Needless to say, this could be varied merely by altering the diffusion or doping time, or the thermal cycle used. The emitter zone 33, in combination with the two P-base zones, thus yield two P-N junctions, 32, 33 and 32, 33. Upon opening base contact holes, and depositing metal contacts, the novel features of the present lateral transistor are completed.

In the monocrystalline method, deep diffusion times and processes can be used without resulting in deep diffusion. This is due to the buried diffusion layer 25 into which the base and emitter diffusions are driven. This buried diffusion layer 25, typically at a concentration in level in the range $10^{14}$ to $10^{20}$ atoms/cc., is of the same dopant type as the base impurity. Since the buried diffusion layer 25 has a dopant level which is too high to be compensated by the emitter impurity, the base region effectively has a very wide base width at the bottom. Accordingly, the effective base width in the side wall periphery area is .25 micron.

This is one possible disadvantage with respect to the polycrystalline method, since the polycrystalline method permits straight side walls to be obtained.

One further embodiment of the present invention exists, and this is basically a variation of the polycrystalline method which comprises a process for forming a "bathtub" isolation, and also the device formed thereby. The following description, wherein an N-pocket is isolated, is made with reference to FIG. 13 of the drawings. As will be appreciated by one skilled in the art, the basic polycrystalline scheme heretofore described is utilized. In this embodiment, the isolation is actually part of the base region, in this instance a P base, which forms the base contact to the narrow base portion.

Figure 13:
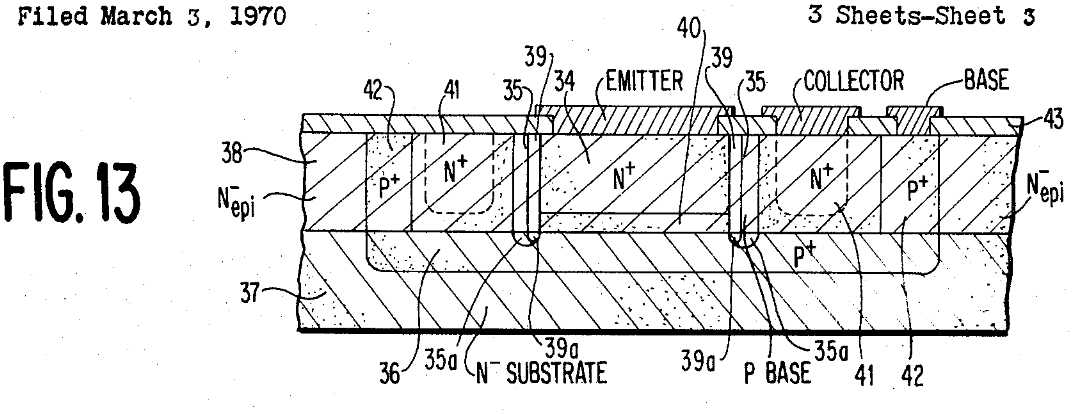
FIGS. 13–17 show various embodiments of lateral transistors according to this invention.

With specific reference to FIG. 13, this illustrates an NPN transistor wherein a central N-type region is surrounded by an annular "bathtub" isolation. It will be appreciated with reference to FIG. 13 that viewed from the top the NPN transistor shown will, insofar as the base and collector are concerned, appear to be a plurality of annular members.

Specifically, the following discussion will explain the various components of the NPN transistor shown in FIG. 13 with direct reference to a process for forming the same. It will be appreciated that the essential processing steps are substantially the same as heretofore described for the polycrystalline-type lateral transistors in the earlier parts of the specification. Further, the emitter, collector and base regions of the lateral transistor in combination with the epitaxial layer and substrate can have any desired state of the art values which have heretofore been utilized for NPN transistors. The lateral PN junction which is formed is, of course, substantially in accordance with the heretofore offered discussions for forming such PN junctions in lateral transistors.

The $N^-$ substrate 37 can be silicon. A $P^+$ zone 36 is formed in substrate 37. An island of silicon dioxide is then formed over a portion of the zone 36. In FIG. 13 this is a circular silicon dioxide disc 40. An $N^-$ epitaxial layer is then grown by any state of the art technique over the assembly. This results in single crystal material 38 over the complete substrate and $P^+$ zone except for polycrystalline silicon mass 34 which grows over the silicon dioxide disc 40. In FIG. 13 a silicon dioxide mask is shown by numeral 43. The openings which are required in this mask to perform the following diffusions will be obvious, and only the final assembly is shown. Of course, any technique which will yield a "doped" zone, as this term is understood in the art, can be used, diffusion from a high temperature atmosphere being only illustrative.

The first diffusion which is conveniently performed is a $P^+$ diffusion to yield annular zone 42. This is actually an annular ring, and can be to any state of the art concentration for usage as a base.

The next diffusion which is performed is, in this description, separate from the diffusion to form the $P^+$ zone 42. Obviously, as the following discussion will make clear, the $P^+$ diffusions could be performed simultaneously. However, in this embodiment diffusion is next conducted with a $P^+$ impurity into the polycrystalline silicon mass 34. The $P^+$ impurity will diffuse into polycrystalline silicon mass 34 and extend laterally into the sides of the polycrystalline mass 34 to yield a $P^+$ zone 35 actually in the single crystal epitaxial material 38. Thus, there will be an annular ring 35 of $P^+$ impurities in the single crystal material 38 around the polycrystalline mass 34.

The next diffusion which is performed is an $N^+$ diffusion to yield $N^+$ zone 41. This again is an annular ring and is between the $P^+$ annular ring 42 and the $P^+$ lateral diffusion 35. State of the art collector concentrations can be used since zone 41 will form the transistor collector.

The final diffusion which is required is an $N^+$ diffusion into the polycrystalline mass 34. It will be obvious that the $N^+$ diffusion which was utilized to form zone 41 could be utilized to simultaneously drive an $N^+$ impurity into the polycrystalline mass 34. However, to avoid any possible lateral spreading of the $P^+$ impurity zone 35, two separate diffusions are preferred. The $N^+$ diffusion inti polycrystalline mass 34, of course, results in a lateral diffusion of the $N^+$ impurity into the single crystal epitaxial layer 38, thereby yielding an $N^+$ annular diffusion 39. It should be noted that this diffusion actually occurs into the heretofore diffused lateral $P^+$ zone 35. There thus results at the intersection of the $P^+$ impurities and the $N^+$ impurities a PN junction, shown in FIG. 13 by the intersection of zones 35 and 39. Mass 34 will now be $N^+$ also.

After the completion of this step, appropriate emitter and base contacts may be made to the NPN transistor. It will be noted in FIG. 13 that a portion of the diffusions laterally to the side of the polycrystalline mass 34 extend beneath the interface of the epitaxial layer 38 and the $P^+$ zone 36. This is due to the fact that diffusion cannot occur to any significant extent through the silicon dioxide island 40. However, to a slight extent, diffusion does occur downward directly beneath the $P^+$ and $N^+$ diffusions 35 and 39, respectively, which occur laterally from the polycrystalline mass 34. The "dimple" which results from the $P^+$ diffusion 35 is represented by numeral 35*a*, and the "dimple" which results from the $N^+$ diffusion 39 is represented by numeral 39*a*. The "dimples" are part of diffusions 35 and 39, and are separately illustrated in the drawing only for clarity.

In essence, the PN junction is thus formed by an extension of the $N^+$ diffusion 39 from the polycrystalline mass 34 into the first $P^+$ diffusion 35. It should be noted that this actually occurs in the monocrystalline silicon layer 38 the junction thus being formed by an "overlap" of zone 39 and zone 35.

An explanation will now be provided of exactly what is meant by the term "bathtub" isolation. As heretofore indicated, the primary advantage of the "bathtub" isolation is that it enables the base contact 42 also to be utilized for an isolation function. In this example, the bathtub is actually formed by the annular ring 42 and the $P^+$ diffused zone 36. It is thus clear that contact can be made to the $P^+$ diffused zone 35 via $P^+$ diffused layer 36 and the $P^+$ annular ring 42. This, of course, is in opposition to a normal vertical transistor of the NPN type wherein the collector would form part of the isolation, and the base would be inside the collector. From the above discussion, it is clear that a maximum of 5 diffusions are required, and, in fact, if simultaneous diffusions are formed as heretofore indicated, less diffusions would be required.

In yet another embodiment of this aspect of the invention, if a rapidly diffusing $P^+$ impurity is utilized in combination with a slow diffusing $N^+$ impurity, the PN junction formed by zones 35–39 could be formed by a single diffusion step. Further, it will be apparent to one skilled in the art that the order of diffusions could be varied, keeping in mind the electrical contacts which are required for an operable transistor.

In the NPN transistor described, the collector is thus clearly shown by diffused zone 41, the emitter is thus represented generically by 34, and the active base region is represented by number 35. The parasitic base contact is thus formed, in effect, by $P^+$ zone 36 and the annular zone 42 in contact with the narrow width transistor base 35.

The metallurgy shown can be any standard state of the art metallurgy as would generally be utilized for emitter, collector, and base contacts. If desired, the contacts can be ohmic and be formed by any standard state of the art procedure.

Figure 14:
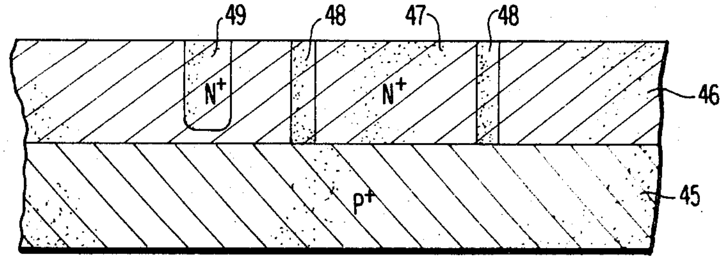

With brief reference to FIG. 14, this is a schematic of a single lateral transistor device. Such a device would find great application where very high power devices are required. The polycrystalline method is used to form this device, and in view of the heretofore offered discussion, it is believed no further amplification is required other than to identify a $P^+$ substrate 45 carrying an N-epitaxial layer 46. Of course, the $N^+$ emitter 47 is formed of the polycrystalline material grown over a silicon dioxide island (not shown). By first diffusion a P-type impurity into the polycrystalline "plug" 47, the P base 48 is formed. By then sequentially diffusion an $N^+$ impurity into the polycrystalline "plug" 47, the P-N junction is formed. Such a junction could be represented by the interface between element 47 and 48. At the same time as the $N^+$ diffusion $N^+$ collector 49 could be formed.

Figure 15:
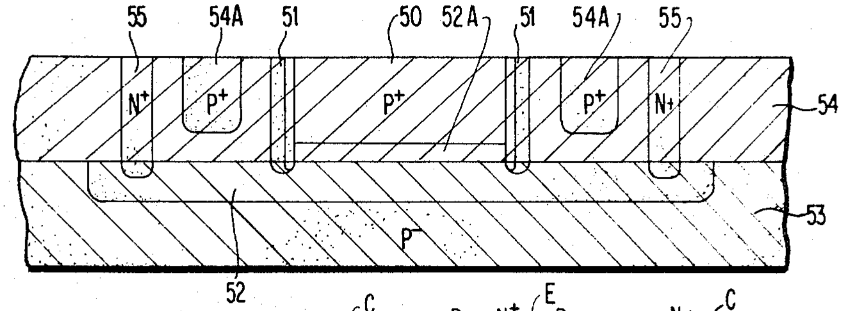

FIG. 15 describes a PNP transistor provided with "bathtub" isolation similar to that shown in FIG. 13. Although the standard emitter, collector and base metallurgy are not shown in FIG. 15, it is believed that one skilled in the art would have no trouble appreciating that the PNP transistor of FIG. 15 is formed by a procedure substantially identical to that shown for the NPN transistor of FIG. 13 with a reversal of all conductivity types.

With specific reference to FIG. 5, there is shown a $P^-$ base 53 having there a $N^+$ diffused region 52. The single crystal epitaxial material is represented in this figure by numeral 54. Of course, polycrystalline silicon mass 50 has been grown over silicon dioxide "island" 52A. The annular $N^+$ diffusion which will form the base is represented by numeral 55, the annular $P^+$ diffusion which will form the collector is represented by numeral 54A, and the PN junction, formed by a reversal of the diffusion sequence of FIG. 13, is generically shown by numeral 51. Of course, numeral 51 would actually comprise an outer annular $N^+$ diffusion and an inner annular $P^+$ diffusion in the single crystal silicon 54 both of these surrounding the final $P^+$ polycrystalline mass 50.

In FIG. 15, the "bathtub" isolation is shown by $N^+$ diffused zones 55 and 52.

Again, it must be reiterated that in both FIGS. 13 and 15 standard state of the art concentrations can be used, as can any standard state of the art material for the substrate, epi layer etc. Further the silicon dioxide over which the polycrystalline silicon will grow can be formed by any state of the art procedure. Finally, it will be obvious that though the impurity zones are annular in this description they can have any shape, so long as they perform their recited function.

As used in the specification and claims, it will be understood that the term annular is used in the sense of encompassing a number of possible configurations. For instance, though a "circular" annulus is shown in the example and is most preferred, it will be apparent that this term implies many polygonal shapes which could be used depending upon the desired device geometry. For instance a rectangular, square, trapezoidal, triangular, irregular, etc. "annulus" could be required, and the use of such a term is meant to encompass such variations and to make it clear this term is to describe such doped impurity containing zones.

Figure 16:
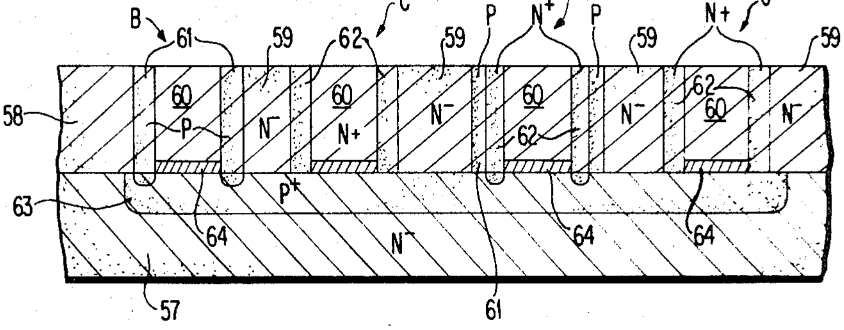
Figure 17:
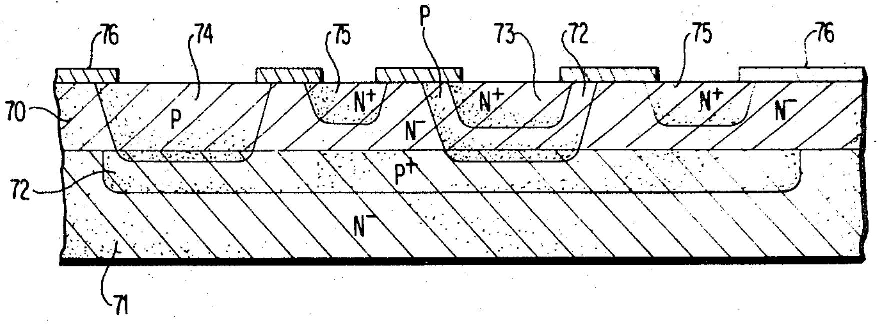

The last two figures of the drawing, FIGS. 16 and 17, are typical silicon semiconductor structures formed by the poly and mono methods. The characteristics of the materials are schematically identified therein.

With reference to FIG. 16, the advantages of the poly method are:

(1) Tight control on epi thickness is not required. Since diffusion of impurities through poly is very fast, the PN junction lateral depth is relatively independent of vertical thickness of epi;

(2) Since the $N^+$ emitter region is almost completely separated from $P^+$ buried layer by a layer of an insulator, one achieves the following characteristics:

(a) Low emitter-base capacitance;
(b) High emitter efficiency since no transfer of carriers is taking place in the parasitic emitter-base junction.

Disadvantages to the mono method (see FIG. 17) are:

(1) Tight epi control is needed because base junction depth has to be equal or greater than epi thickness;
(2) $N^+$ emitter directly forms a junction with the $P^+$ buried layer causing high emitter base capacitance and low emitter efficiency and collection efficiency. This problem could be minimized by using small horizontal geometries so that the wall area of the emitter is equal to or more than its floor area. The advantage of the mono method is that monocrystalline elements are more commonly used, and hence more easily integrated into present day technology.

With reference to FIG. 16, the $N^-$ substrate 57 has grown thereon an epitaxial layer 58 which compromises an $N^-$ single crystal portion 59 and polycrystalline portions 60. Lateral diffusions with a P type conductivity are shown by numeral 61, and those with an N conductivity by numeral 62. Of course, a $P^+$ diffusion 63 in the substrate 57 is partially covered with silicon dioxide islands 64 to grow the polycrystalline silicon 60 thereover. This structure, which is similar to FIG. 2*b* for contact arrangement can thus be seen to comprise a base region B to the left of an annular collector region C, the collector region surrounding emitter region E.

With reference to FIG. 17, this also has an epi layer 70 grown over an $N^-$ substrate 71 with a $P^+$ doped zone 72 therein. However, according to the single crystal or mono process, the diffusions occur directly into the single crystal material without a poly route being involved. Thus, a P-N junction such as formed by P diffusion 72 and N diffusion 73 will have a sloping sidewall or "dish" formation. Of course, when forming other P diffusions 74 or N diffusion 75 where no junction is to be formed appropriate masking is used, e.g., the $SiO_2$ mask 76.

While the invention has been particularly shown and described with reference to a preferred embodiment thereof, it will be understood by those skilled in the art that various changes in form and details may be made therein without departing from the spirit and scope of the invention.

What is claimed is:

1. A process for forming a semiconductor device which comprises:

forming an impurity-containing zone of one impurity type extending over a portion of a semiconductor substrate;

forming a discrete silicon dioxide zone on said semiconductor substrate at least over a portion of said one impurity type doped zone;

epitaxially depositing a layer over said semiconductor substrate and said discrete silicon dioxide zone whereby polycrystalline material forms over said discrete silicon dioxide zone and single crystal material forms over the remainder of said substrate;

diffusing an impurity of a first conductivity type through a mask having an opening over said polycrystalline material whereby diffusion occurs through said polycrystalline material and into said single crystal material thereby establishing a diffused zone in a direction substantially perpendicular to said semiconductor substrate;

diffusing a second impurity of opposite conductivity type to said first conductivity type impurity at the location of said opening of said mask whereby said second impurity material diffuses through said polycrystalline material and into said single crystal material substantially parallel to and contiguous with said first impurity material, thereby establishing a junction in said single crystal material, said junction being in a direction substantially perpendicular to said semiconductor substrate, said silicon dioxide zone being a material which is not monocrystalline and which acts as a diffusion mask against said impurities of said first and said opposite conductivity types.

2. The process of claim 1 wherein said one impurity and said first impurity are of the same conductivity type.

3. The process of claim 2 wherein said one impurity and said first impurity are both P conductivity type.

4. The process of claim 3 wherein said second impurity is N-type.

5. The process of claim 1 wherein a plurality of said junctions are formed, at least two of said junctions being in electrical contact with each other by means of said diffused P+ impurity containing zone.

6. A process of forming a semiconductor structure comprising:

forming in a semiconductor substrate of one type conductivity a low resistivity region of opposite type conductivity extending inwardly from one surface of said substrate;

forming on said one surface a discrete silicon dioxide region;

forming on said substrate and said silicon dioxide region an epitaxial layer of semiconductor material of said one type conductivity, whereby monocrystalline material grows over said substrate and said low resistivity region and polycrystalline material grows over said silicon dioxide region, and whereby said low resistivity region is a buried region, forming a first annular region of impurity in said monocrystalline material spaced from said polycrystalline material, said first annular region being of said opposite type conductivity region and in electrical contact with said low resistivity region whereby said polycrystalline material is electrically isolated;

forming a second annular region of impurity around said polycrystalline region by doping a first impurity of said opposite type conductivity through a mask having an opening over said polycrystalline region whereby said impurity passes through said polycrystalline region and into said single crystal material;

diffusing a second impurity at the location of said opening in said mask and into said polycrystalline material, said second impurity having a conductivity type opposite from said first impurity diffused into said polycrystalline region and the same as said one-type conductivity whereby there is imparted to said polycrystalline material a conductivity type opposite from the conductivity of said low resistivity region, said silicon dioxide region being a material which is not monocrystalline and which acts as a diffusion mask against said first and second impurities.

7. The process of claim 6 wherein said second impurity diffused into said polycrystalline material forms an annular region interior to and of the opposite conductivity type of said second annular region, whereby there is formed a junction.

8. The process of claim 7 further comprising forming a third annular region in said monocrystalline material between said first annular region and said second annular region surrounding said polycrystalline material, said third annular region having a conductivity type opposite that of the conductivity type of said first annular region.

9. The process of claim 8 wherein said low resistivity region of opposite type conductivity formed in said semiconductor substrate is P-type in conductivity.

10. The process of claim 8 wherein said low resistivity region of opposite type conductivity formed in said semiconductor substrate is N-type in conductivity.

11. The process of claim 10 wherein said second annular region of impurity around said polycrystalline region is P-type, and said annular region interior of said second annular region is N-type, whereby there is formed a PN junction.

12. The process of claim 11 wherein said first annular region and said second annular region formed in said monocrystalline material are in electrical contact by means of said low resistivity region.

13. The process of claim 12 which further comprises forming electrical connections to said first annular region, said third annular region and said polycrystalline mass, thereby providing, respectively, base, collector and emitter electrical connections.

References Cited

UNITED STATES PATENTS

| | | | |
|---|---|---|---|
| 3,328,214 | 6/1967 | Hugle | 148—175 |
| 3,390,022 | 6/1968 | Fa | 148—33 |
| 3,411,051 | 11/1968 | Kilby | 317—235 |
| 3,475,661 | 10/1969 | Iwata et al. | 317—234 |
| 3,514,676 | 5/1970 | Fa | 317—235 |

FOREIGN PATENTS

| | | | |
|---|---|---|---|
| 1,926,884 | 12/1969 | Germany | 317—235 |

OTHER REFERENCES

"Monolithic IC Puts Out 18 Watts" Electronics, Mar. 17, 1969, p. 185-6.

L. DEWAYNE RUTLEDGE, Primary Examiner
W. G. SABA, Assistant Examiner

U.S. Cl. X.R.

29—577, 578; 117—201, 212; 148—1.5, 174, 187, 190; 317—235 R